United States Patent
Igarashi

(10) Patent No.: US 8,036,874 B2
(45) Date of Patent: Oct. 11, 2011

(54) SOFTWARE EXECUTING DEVICE AND CO-OPERATION METHOD

(75) Inventor: Masato Igarashi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 565 days.

(21) Appl. No.: 12/142,998

(22) Filed: Jun. 20, 2008

(65) Prior Publication Data

US 2009/0006068 A1    Jan. 1, 2009

(30) Foreign Application Priority Data

Jun. 21, 2007   (JP) ................................. 2007-163652

(51) Int. Cl.
*G06F 9/445* (2006.01)
*G06F 17/50* (2006.01)

(52) U.S. Cl. ................ 703/22; 703/17; 703/24; 703/27; 710/317; 702/123

(58) Field of Classification Search .............. 703/2, 14, 703/22, 24, 27, 17; 716/4; 710/317; 702/123
See application file for complete search history.

(56) References Cited

U.S. PATENT DOCUMENTS

| | | | | |
|---|---|---|---|---|
| 4,862,347 A * | 8/1989 | Rudy | ............................... | 703/14 |
| 5,327,361 A * | 7/1994 | Long et al. | ..................... | 703/15 |
| 5,721,953 A * | 2/1998 | Fogg et al. | ..................... | 710/21 |
| 6,356,862 B2 | 3/2002 | Bailey | | |
| 6,754,763 B2 * | 6/2004 | Lin | ............................... | 710/317 |
| 6,785,873 B1 * | 8/2004 | Tseng | ............................... | 716/4 |
| 2003/0144828 A1 * | 7/2003 | Lin | ................. | 703/21 |
| 2003/0188299 A1 * | 10/2003 | Broughton et al. | ........... | 717/141 |
| 2006/0058976 A1 * | 3/2006 | Ferris | ............................ | 702/123 |
| 2008/0080651 A1 * | 4/2008 | Edgar | ........................ | 375/356 |
| 2008/0209425 A1 * | 8/2008 | Ferris | ............................ | 718/102 |

FOREIGN PATENT DOCUMENTS

| | | |
|---|---|---|
| JP | 05-241891 | 9/1993 |
| JP | 07-271632 | 10/1995 |
| JP | 09-231255 | 9/1997 |
| JP | 2001-290860 | 10/2001 |
| JP | 2007-058813 | 3/2007 |

OTHER PUBLICATIONS

Japanese Office Action corresponding to U.S. Appl. No. 12/142,998 mailed on Jul. 14, 2009.

* cited by examiner

*Primary Examiner* — Thai Phan
(74) *Attorney, Agent, or Firm* — Turocy & Watson, LLP

(57) ABSTRACT

There is provided with a software executing device co-operating with a hardware circuit or a hardware simulator, including: a software executing unit configured to execute a software; an execution monitoring unit configured to monitor execution of the software by the software executing unit to sequentially obtain an execution state of the software; a determining unit configured to determine whether the software executing unit and the hardware circuit or the hardware simulator are to be synchronized based on an obtained execution state of the software; and a synchronization controlling unit configured to control synchronization between the software executing unit and the hardware circuit or the hardware simulator.

20 Claims, 14 Drawing Sheets

| CONDITION | ACTION |
|---|---|
| PC CORRESPONDS TO 0x00000180 | START |
| PC CORRESPONDS TO 0xbfc00380 | TARMINATE |
| ACCESS TO ADDRESS 0x80000010 OCCURS | START |
| VALUE OF ADDRESS 0xFFFFF320 CORRESPONDS TO 0x80 | START |
| THIRD BIT OF ADDRESS 0x80001000 CORRESPONDS TO 1 | TERMINATE |
| PER-CYCLE SYNCHRONIZATION PERIOD EXCEEDS 1000 CYCLES | TERMINATE |
| PC ENTERS RENGE OF 0xbfc00180 TO 0xbfc0037f | START |

FIG. 2

SOFTWARE EXECUTING DEVICE AND CO-OPERATION METHOD

CROSS REFERENCE TO RELATED APPLICATIONS

This application is based upon and claims the benefit of priority from the prior Japanese Patent Applications No. 2007-163652, filed on Jun. 21, 2007; the entire contents of which are incorporated herein by reference.

BACKGROUND OF THE INVENTION

1. Field of the Invention

The present invention relates to a software executing device and a co-operation method, which are used, for example, in a hardware/software co-simulation environment.

2. Related Art

Hardware/software co-simulation (HW/SW co-simulation) is used to shorten time to market (TTM) for a system on chip (SoC) by starting verification of software/firmware (SW/FW) using HW simulation before the SoC is completed, or to reduce production man-hours of a test vector for verification by giving a test input to an HW description which is an object of verification, from a central processing unit (CPU) model of an SW simulation environment.

In order to start the verification of software before the SoC is completed, it is necessary to simulate hardware operations in addition to an environment for performing software simulation (referred to as an SW simulator below). Simulating the operations is roughly classified into a method of simulating an existing HW description itself, and a method of creating an HW model for simulation which operates at a higher speed. Also, a scheme of writing the existing HW description on an FPGA board or the like and bringing the FPGA board into collaboration with a simulator has begun to be used recently (for example, FPGA board, ZeBu series, manufactured by EVE (http://www.eve-team.com/, Nihon EVE K.K., http://www.eve-japan.co.jp/)).

By performing co-simulation of the FPGA board and the SW simulator, the HW description can be operated at a high speed. There is also such an advantage that existing HW assets and intellectual property (IP) can be directly used.

Since it is not necessary to create a new HW model for simulation, such advantages are also considered to be obtained that turn around time (TAT) for verifying software can be shortened, cost reduction can be expected, and at the same time, the issue of accuracy of the HW model for simulation can be cleared.

On the other hand, in the co-simulation of the SW simulator and the FPGA board, the SW simulator is software operating on a general-purpose computer, and the FPGA board is hardware implemented on a dedicated board or the like and connected to the general-purpose computer. Thus, it is important how to synchronize operations between the SW simulator and the FPGA board.

Concerning synchronization between the SW simulator and the FPGA board, a per-cycle synchronization scheme, a scheme of using a bus transactor, a scheme of controlling a synchronization interval in an SW simulator side, a scheme of determining whether there is an interrupt possibility, or the like are conventionally known.

The per-cycle synchronization scheme is a scheme in which a clock signal is generated from the SW simulator side and the FPGA board is operated based on the clock signal. In the scheme, it is necessary to shorten a synchronization interval in order to perform accurate simulation. Thus, there is such a problem that a decrease in a simulation speed is caused.

The scheme of using a bus transactor is a scheme in which access from the SW simulator side to the FPGA board is always performed by a bus transaction (granularity at a bus-command level such as READ and WRITE) and the bus transaction is converted to a cycle level signal by the bus transactor on the FPGA board, so as to operate the HW description written on the FPGA board. A scheme in which a synchronization command (for example, "advance for 100 clocks") is issued from the SW simulator side other than during occurrence of the bus transaction to control operations in the FPGA board side is the scheme of controlling a synchronization interval in the SW simulator side. All of these schemes are schemes of controlling a synchronization period and interval in the software side. Since it is difficult to accurately handle a time of occurrence of an event (an interrupt request or the like) from the hardware side, there is such a problem that simulation accuracy is reduced.

The scheme of determining whether there is an interrupt possibility is disclosed in JP-A 2001-290860(Kokai). The scheme improves a simulation processing speed by determining in advance in the SW simulator side whether there is a possibility that an interrupt occurs from an HW simulator side, and performing no synchronization with a part of hardware where there is no interrupt possibility. In the scheme, concerning whether an interrupt occurs, what "incorporated software" operating on a "CPU simulating unit" writes to an address mapped into a register of an interrupt controller is monitored and how the "incorporated software" sets interrupts from respective "peripheral circuits" is recorded during simulation execution, so as to determine whether there is an interrupt from the HW simulator on SW simulation. Since specifications (a register address, a method of controlling the interrupts from respective peripheral circuits) of the "interrupt controller" which differ in each SoC are incorporated in the CPU simulating unit in this scheme, it is necessary to create a CPU simulating unit for each SoC, or to configure settings so that the specifications of the "interrupt controller" which differ in each SoC are simulated. Thus, the simulator has poor general-purpose properties. Also, a mechanism for simulating the specifications of the "interrupt controller" which differ in each SoC means that an interrupt controller model for simulation is created, and the same problem as that in creating the HW model for simulation described above could be caused.

SUMMARY OF THE INVENTION

According to an aspect of the present invention, there is provided with a software executing device co-operating with a hardware circuit or a hardware simulator, comprising:

a software executing unit configured to execute a software;

an execution monitoring unit configured to monitor execution of the software by the software executing unit to sequentially obtain an execution state of the software;

a determining unit configured to determine whether the software executing unit and the hardware circuit or the hardware simulator are to be synchronized based on an obtained execution state of the software; and a synchronization controlling unit configured to control synchronization between the software executing unit and the hardware circuit or the hardware simulator.

According to an aspect of the present invention, there is provided with a co-operation system including a hardware circuit or a hardware simulator, and a software executing device co-operating with the hardware circuit or the hardware simulator, wherein the software executing device comprising:

a software executing unit configured to execute a software;

an execution monitoring unit configured to monitor execution of the software by the software executing unit to sequentially obtain an execution state of the software;

a determining unit configured to determine whether the software executing unit and the hardware circuit or the hardware simulator are to be synchronized based on an obtained execution state of the software; and a synchronization controlling unit configured to control synchronization between the software executing unit and the hardware circuit or the hardware simulator.

According to an aspect of the present invention, there is provided with a co-operation method of bringing a software executing device into co-operation with a hardware circuit or a hardware simulator, comprising:

executing the software at the software executing device;

monitoring an execution of the software to sequentially obtain an execution state of the software;

determining whether the software executing device and the hardware circuit or the hardware simulator are to be synchronized based on an obtained execution state of the software; and synchronizing the software executing device and the hardware circuit or the hardware simulator when the software executing device and the hardware circuit or the hardware simulator are determined to be synchronized.

BRIEF DESCRIPTION OF THE DRAWINGS

FIG. 2 illustrates an example of synchronization period information;

DETAILED DESCRIPTION OF THE INVENTION

Figure 1:
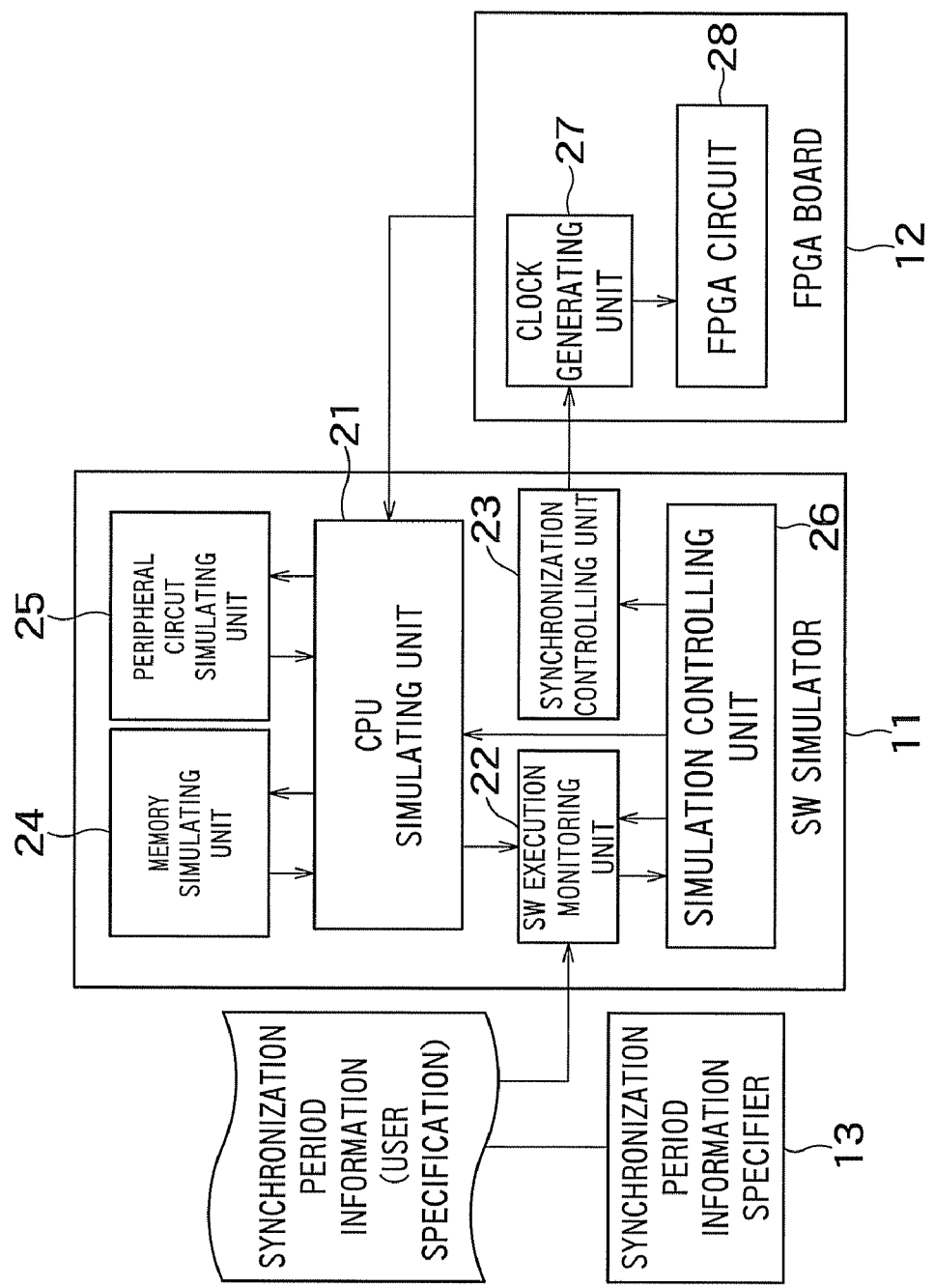
FIG. 1 is an entire configuration diagram of a hardware/software co-simulator according to a first embodiment of the present invention.

First, it will be described how the present inventor have achieved the present invention.

In hardware/software co-simulation, requirements for operations in a hardware side seen from a software side, by mainly focusing on verification of software which operates on an SW simulator (an environment for simulating software), can be summarized in below three points:

(1) it is possible to transfer correct data to and from hardware by read/write operations on a register, (2) operations in the hardware side caused by the read/write operations on a register are correctly executed, and a correct result can be obtained, and (3) the result of the operations in the hardware side is terminated at a correct time.

(1) and (2) can be sufficiently achieved by the scheme of using a bus transactor described in the related art. However, concerning (3), the SW simulator side cannot accurately detect a termination time of the operations in the hardware side only by the scheme of using a bus transactor. Although the per-cycle synchronization scheme can achieve all (1), (2), and (3) described above, there is the problem that the decrease in a simulation speed is caused as described in the related art.

However, the result of the operations in the hardware side, which is important in (3), is a result of an approach from the software side to the hardware side in (2) in most cases (there could be other cases, however, these cases are caused by an event occurring from outside without any causal relationship with operations in the software side, and a time of the event occurrence is not important in the software verification).

That is, what is important in the software verification other than logically correct hardware operations is whether the correct time in (3) can be obtained in response to the approach from the software side in (2). In other words, as long as a correct operation time in the hardware side can be obtained by performing per-cycle synchronization only in a period from when the software side activates a hardware operation until when the operation in the hardware side is terminated, it is not necessary to synchronize operations between the software side and the hardware side in other time periods.

Also, in the software verification, the period in which the synchronization is required is different depending on a verified item of the software, and in many cases, it is not necessary to perform synchronization on a hardware operation which is not required for the verification.

In light of the above points, the present inventor have found that the simulation speed can be dramatically improved by setting a period from the point when software activates a certain hardware operation to the point when the operation is terminated to a synchronization period in accordance with a verified item of the software, and performing synchronization only in the synchronization period without performing synchronization in other periods. Embodiments of the present invention achieved based on the finding will be described in detail below.

First Embodiment

FIG. 1 is a block diagram illustrating an entire configuration of a hardware/software (HW/SW) co-simulator including a software simulator (SW simulator) 11 according to a first embodiment of the present invention. The SW simulator 11 shown in the drawing illustrates by blocks various functions obtained by executing a simulation program for achieving the present invention on a general-purpose computer. A device on which the simulation program is mounted corresponds to one embodiment of a software executing device according to the present invention.

The HW/SW co-simulator performs verification of software executed on a CPU simulating unit 21 in the SW simulator 11 by co-simulation of the SW simulator 11 and an FPGA board (hardware circuit) 12.

A synchronization period information specifier 13 shown in FIG. 1 is a program having a text editor or a dedicated graphical user interface (GUI), and a user specifies a start condition and a termination condition of the period in which the SW simulator 11 and the FPGA board 12 are "synchronized in each cycle". The start condition and the termination condition specified by the synchronization period information specifier 13 are stored in a file or the like as synchronization period information. FIG. 2 illustrates an example of the synchronization period information.

As shown in FIG. 2, as the start condition (condition concerning an action of "start") and the termination condition (condition concerning an action of "termination") of per-cycle synchronization, such conditions as described below can be specified:

a program counter (PC) corresponds to a certain value (PC comparison condition), access to a certain address occurs (address comparison condition), a memory/register value of a certain address or a bit in one part thereof corresponds to a certain value (memory/register value comparison condition), and PC enters a certain period (PC period condition).

Also, by monitoring a period (the number of cycles) in which the per-cycle synchronization is performed other than an execution state of software, an upper limit of the period can be specified as the termination condition (cycle number comparison condition). However, in this embodiment, the cycle number comparison can be described in only one place (only one cycle number comparison can be described) in the synchronization period information as the termination condition.

Here, the start conditions and the termination conditions do not have to respectively correspond to each other. For example, the termination condition which corresponds to the start condition of "PC corresponds to 0x00000180" in the first line of the synchronization period information in FIG. 2 may be "PC corresponds to 0xbfc00380" in the second line, or may be "the third bit of address 0x80001000 corresponds to 1" in the fifth line.

Figure 3:
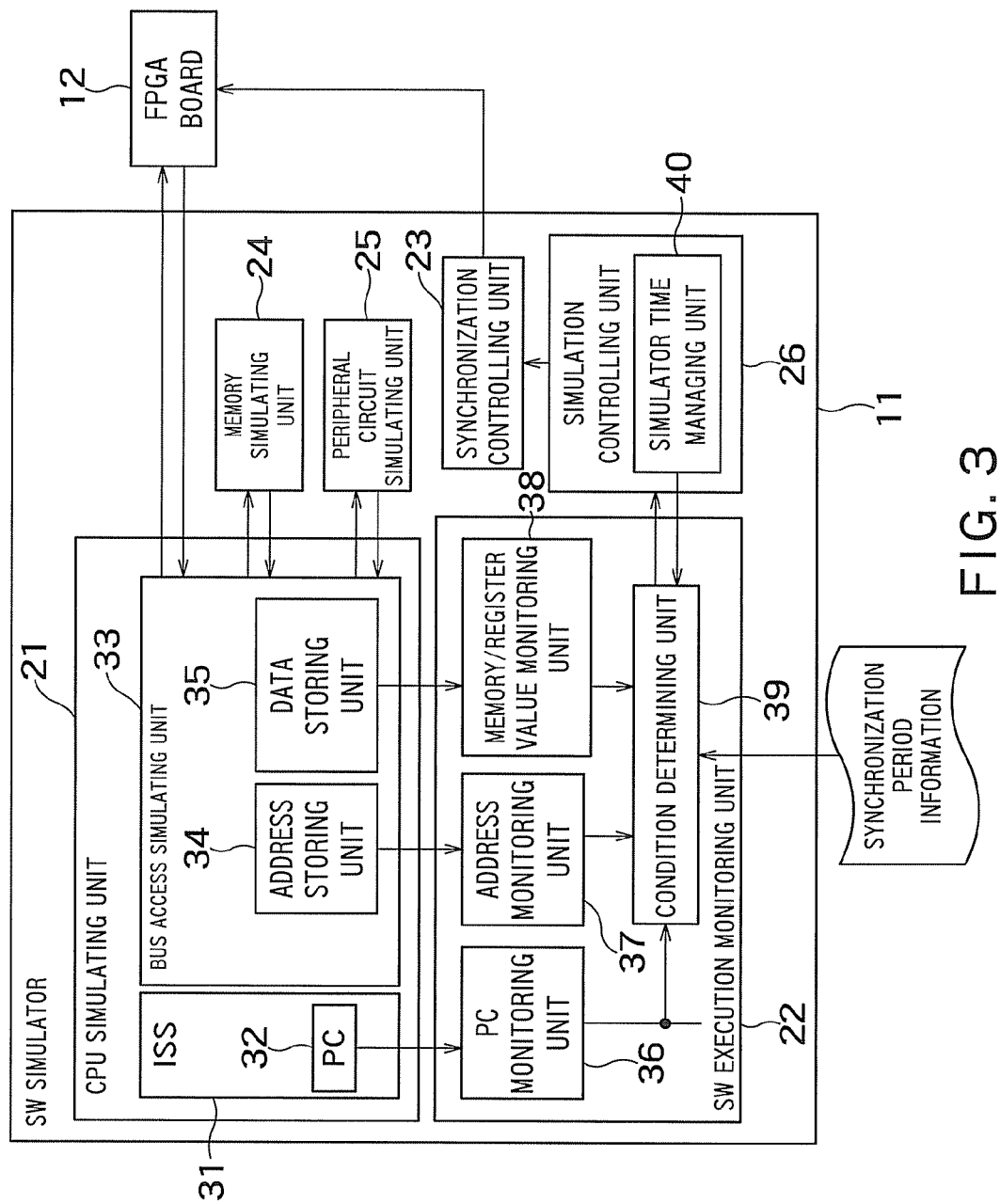
FIG. 3 is a detailed configuration diagram of an SW simulator.

FIG. 3 is a block diagram illustrating a detailed configuration of the SW simulator 11.

The CPU simulating unit 21 includes a unit (ISS: instruction set simulator) 31 for simulating execution of software (instruction set) which is an object of verification. The ISS 31 includes the software (not shown) which is an object of verification, and a program counter (PC) 32 indicating an address of an instruction to be executed.

The CPU simulating unit 21 also includes a bus access simulating unit 33 for simulating bus access. The bus access simulating unit 33 includes an address storing unit 34 for storing an address to be accessed when the bus access is performed, and a data storing unit 35 for storing read data which is read out by the access and write data which is written during the access. The CPU simulating unit 21 may also include a unit for simulating an internal pipeline state or a unit for simulating an internal cache memory.

The bus access simulating unit 33 is connected to, and communicates with a memory simulating unit 24 for simulating memory operations, a peripheral circuit simulating unit 25 for simulating peripheral circuit operations, and further, the FPGA board 12. The peripheral circuit operations are normally emulated by an RTL written on the FPGA board 12. However, some peripheral circuits may be operated in the SW simulator 11 as the peripheral circuit simulating unit as in the present embodiment.

An SW execution monitoring unit 22 monitors execution of the software as a verification object in the CPU simulating unit 21 based on the synchronization period information. The SW execution monitoring unit 22 instructs a simulation controlling unit 26 to start the per-cycle synchronization when the start condition of the per-cycle synchronization is satisfied, and instructs the simulation controlling unit 26 to terminate the per-cycle synchronization when the termination condition of the per-cycle synchronization is satisfied.

The SW execution monitoring unit 22 includes a PC monitoring unit 36 for monitoring the program counter 32, an address monitoring unit 37 for monitoring the address in the bus access based on the address storing unit 34, and a memory/register value monitoring unit 38 for monitoring the read/write data to and from a memory/register in the bus access based on the data storing unit 35. The SW execution monitoring unit 22 further includes a condition determining unit 39 for determining whether the conditions are truly satisfied by comparing the start and termination conditions of the per-cycle synchronization described in the synchronization period information with internal information (the execution state of the software) of the CPU simulating unit 21 obtained from the respective monitoring units 36 to 38. When the length of the synchronization period (the number of clock cycles) is specified as the termination condition of the synchronization period, the condition determining unit 39 also checks whether the number of cycles has reached the number of cycles specified as the termination condition (namely, whether a predetermined period of time has elapsed after entering the synchronization period) by obtaining the number of cycles at the point of time per one cycle from a simulator time managing unit (time counter) 40 of the simulation controlling unit 26.

Figure 4:
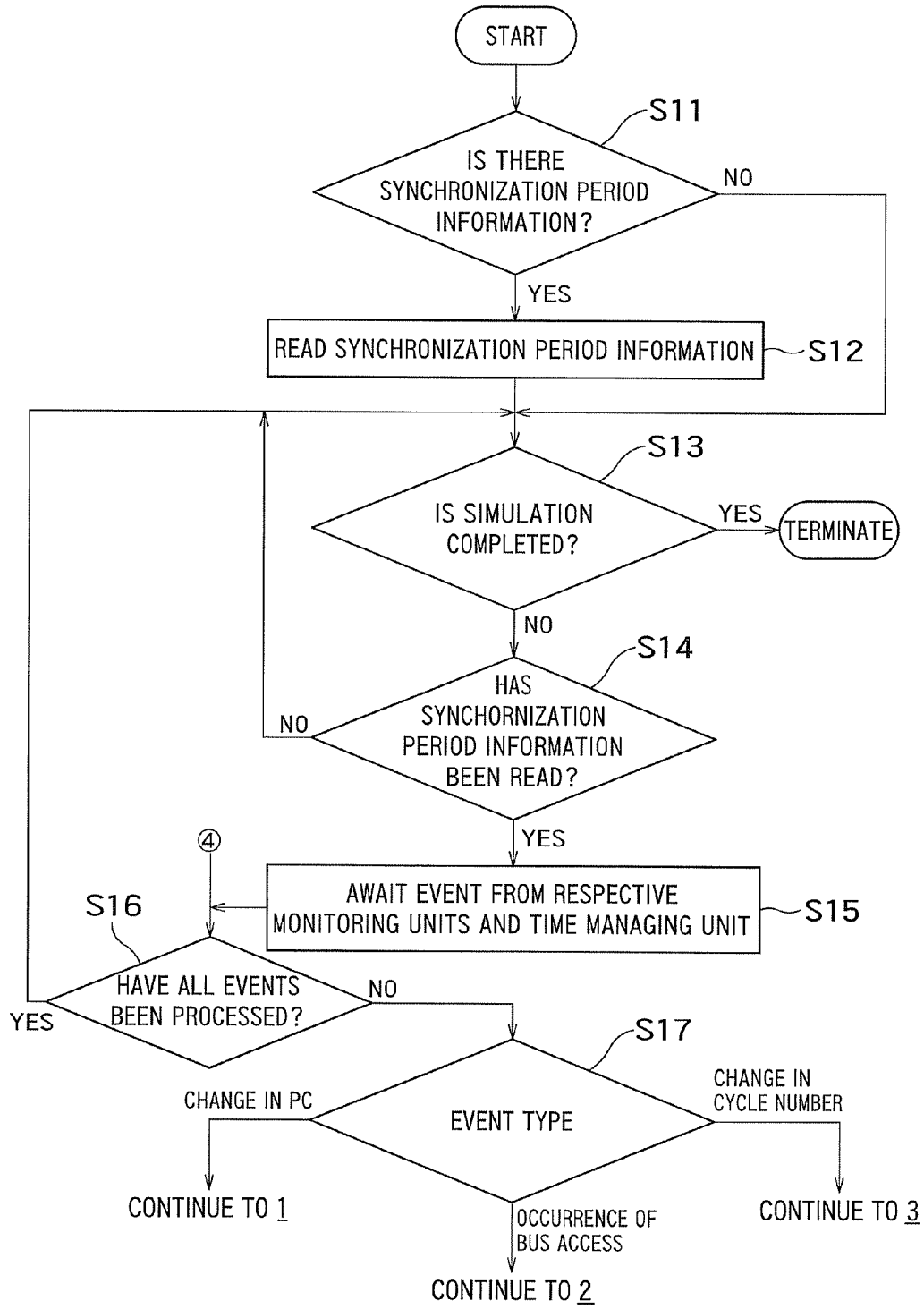
FIG. 4 is a flowchart explaining a process flow of a condition determining unit.

FIG. 4 is a flowchart illustrating an entire process flow of the condition determining unit 39.

The condition determining unit 39 checks whether there is the synchronization period information specified by the synchronization period information specifier 13 (S11). When there is the synchronization period information, the condition determining unit 39 reads the synchronization period information (S12). After reading the synchronization period information, the condition determining unit 39 checks whether the simulation has been completed (S13). When the simulation has been completed (S13, YES), the condition determining unit 39 terminates the process. When the simulation has not been completed (S13, NO), the condition determining unit 39 checks whether the synchronization period information has been read (S14). When the synchronization period information has not been read (S14, NO), the condition determining unit 39 performs conventional-scheme simulation specified in advance. On the other hand, when the synchronization period information has been read (S14, YES), the condition determining unit 39 awaits an event from the respective monitoring units 36 to 38 and the simulator time managing unit 40 (S15). When there occurs an event, the condition determining unit 39 checks a type of the event (S17). When the type of the event is a change in the program counter, the process moves to a process flow shown in a flowchart of FIG. 5 (a process flow with respect to the PC comparison condition/PC period condition). When the type of the event is occurrence of the bus access, the process moves to a process flow shown in a flowchart of FIG. 6 (a process flow with respect to the address comparison condition and the memory/register value comparison condition). When the type of the event is a change in the number of cycles, the process moves to a process flow shown in a flowchart of FIG. 7 (a process flow with respect to the cycle number comparison condition). When there occur a plurality of events from the respective monitoring units 36 to 38 and the simulator time managing unit 40, the condition determining unit 39 performs processing in accordance with each event of all the events which occurred (S16, 17).

Figure 5:
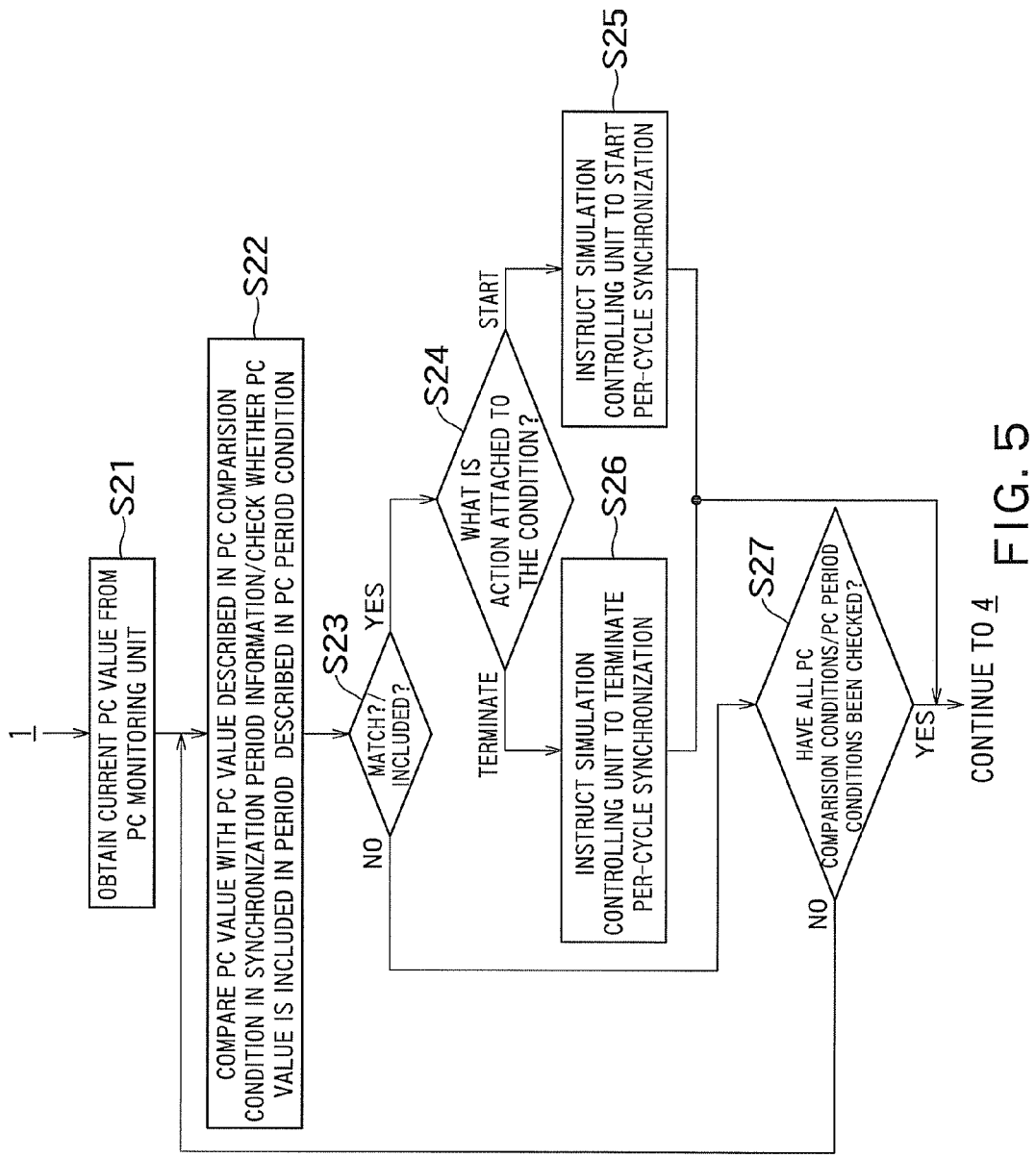
FIG. 5 is a flowchart explaining a process flow of a condition determining unit following FIG. 4.

As shown in FIG. 5, in the process flow with respect to the PC comparison condition/PC period condition, the condition determining unit 39 obtains a current program counter value (PC value) from the PC monitoring unit 36 (S21), and compares the obtained program counter value with the program counter value described in the PC comparison condition in the synchronization period information (S22). The condition determining unit 39 also checks whether the obtained program counter value is included in the period described in the PC period condition in the synchronization period information (S22).

When the comparison result shows disagreement or the obtained program counter value is not included in the above period (S23, NO), the condition determining unit 39 checks whether all the PC comparison conditions/PC period conditions have been checked (S27). When not all have been checked (S27, NO), the condition determining unit 39 checks the PC comparison conditions/PC period conditions which have not been checked yet (S22). When all the PC comparison conditions/PC period conditions have been checked (S27, YES), the process returns to S13 in FIG. 4.

On the other hand, when the comparison result shows agreement or the obtained program counter value is included in the above period (S23, YES), the condition determining unit 39 checks an action attached to the PC comparison condition/PC period condition (S24). When the action indicates start, the condition determining unit 39 instructs the simulation controlling unit 26 to start the per-cycle synchronization (S25). When the action indicates termination, the condition determining unit 39 instructs the simulation controlling unit 26 to terminate the per-cycle synchronization (S26). After S25 or S26, the process returns to S13 in FIG. 4. There is no case in which the PC comparison condition and the PC period condition described in the synchronization period information are redundantly satisfied with respect to the program counter value.

Figure 6:
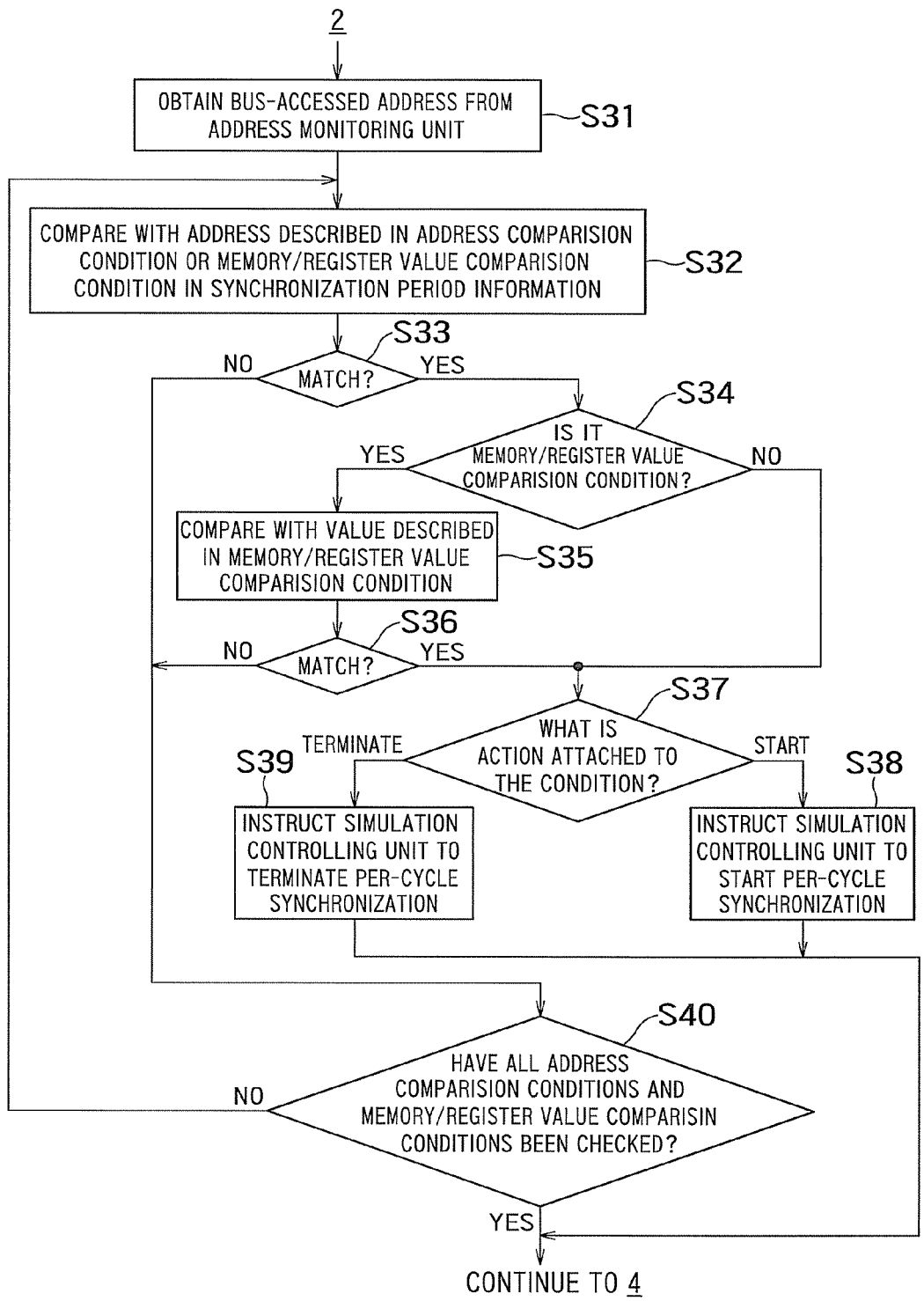
FIG. 6 is a flowchart explaining a process flow of a condition determining unit following FIG. 4.

As shown in FIG. 6, in the process flow with respect to the address comparison condition and the memory/register value comparison condition, the condition determining unit 39 obtains a bus-accessed address from the address monitoring unit 37 (S31), and compares the obtained address with the address described in the address comparison condition or the memory/register value comparison condition in the synchronization period information (S32).

When the both addresses-do not match each other (S33, NO), the condition determining unit 39 checks whether all the address comparison conditions or the memory/register value comparison conditions have been checked (S40). When not all have been checked (S40, NO), the condition determining unit 39 checks the conditions which have not been checked yet (S32). When all the conditions have been checked (S40, YES), the process returns to S13 in FIG. 4.

When the both addresses match each other (S33, YES), the condition determining unit 39 checks whether the condition is the memory/register value comparison condition or the address comparison condition (S34). When the condition is the memory/register value comparison condition (S34, YES), the condition determining unit 39 compares a value stored in the obtained address or a value written to the obtained address with the value described in the memory/register value comparison condition (S35). When the comparison result shows agreement (S36, YES) or the above condition is the address comparison condition (S34, NO), the condition determining unit 39 checks an action attached to the condition (S37). When the action indicates start, the condition determining unit 39 instructs the simulation controlling unit 26 to start the per-cycle synchronization (S38). When the action indicates termination, the condition determining unit 39 instructs the simulation controlling unit 26 to terminate the per-cycle synchronization (S39). After S38 or S39, the process returns to S13 in FIG. 4. When the comparison result shows disagreement in S36 (S36, NO), the process moves to S40 and the condition determining unit 39 checks whether all the address comparison conditions or the memory/register value comparison conditions have been checked. When not all have been checked (S40, NO), the condition determining unit 39 checks the conditions which have not been checked yet (S32). When all the conditions have been checked (S40, YES), the process returns to S13 in FIG. 4.

Figure 7:
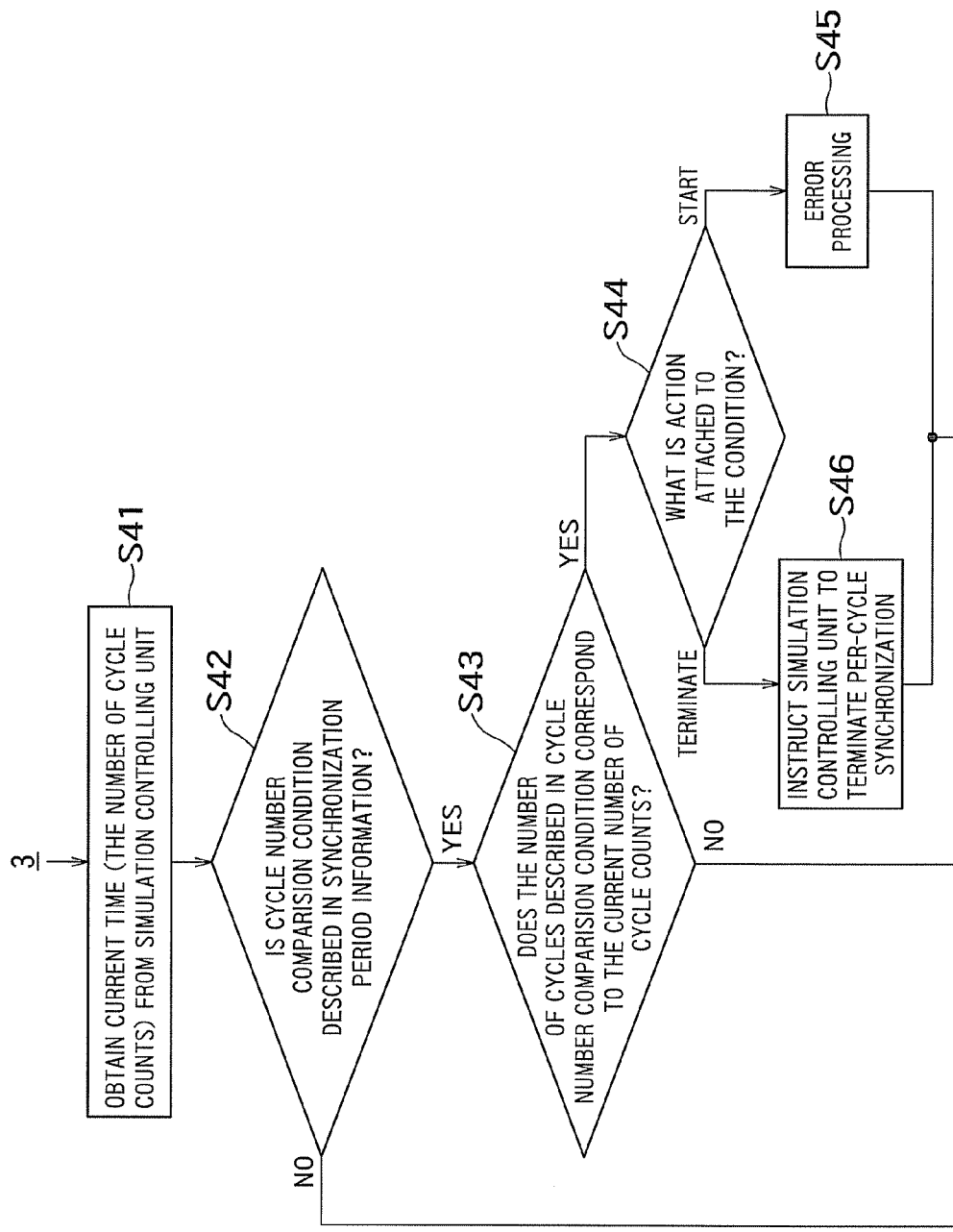
FIG. 7 is a flowchart explaining a process flow of a condition determining unit following FIG. 4.

As shown in FIG. 7, in the process flow with respect to the cycle number comparison condition, when the condition determining unit 39 obtains a current time (the number of cycle counts) from the simulator time managing unit 40 in the simulation controlling unit 26 (S41), the condition determining unit 39 checks whether the cycle number comparison condition is described in the synchronization period information (S42). When the cycle number comparison condition is not described (S42, NO), the process returns to S13 in FIG. 4. When the cycle number comparison condition is described (S42, YES), the condition determining unit 39 checks whether the obtained number of cycle counts corresponds to the number of cycles described in the cycle number comparison condition (S43). When the checking result shows disagreement (S43, NO), the process returns to S13 in FIG. 4. When the checking result shows agreement (S43, YES), the condition determining unit 39 checks an action attached to the condition (S44). When the action indicates start, the condition determining unit 39 performs error processing (S45). When the action indicates termination, the condition determining unit 39 instructs the simulation controlling unit 26 to terminate the per-cycle synchronization (S46). After S45 or S46, the process returns to S13 in FIG. 4.

Figure 8:
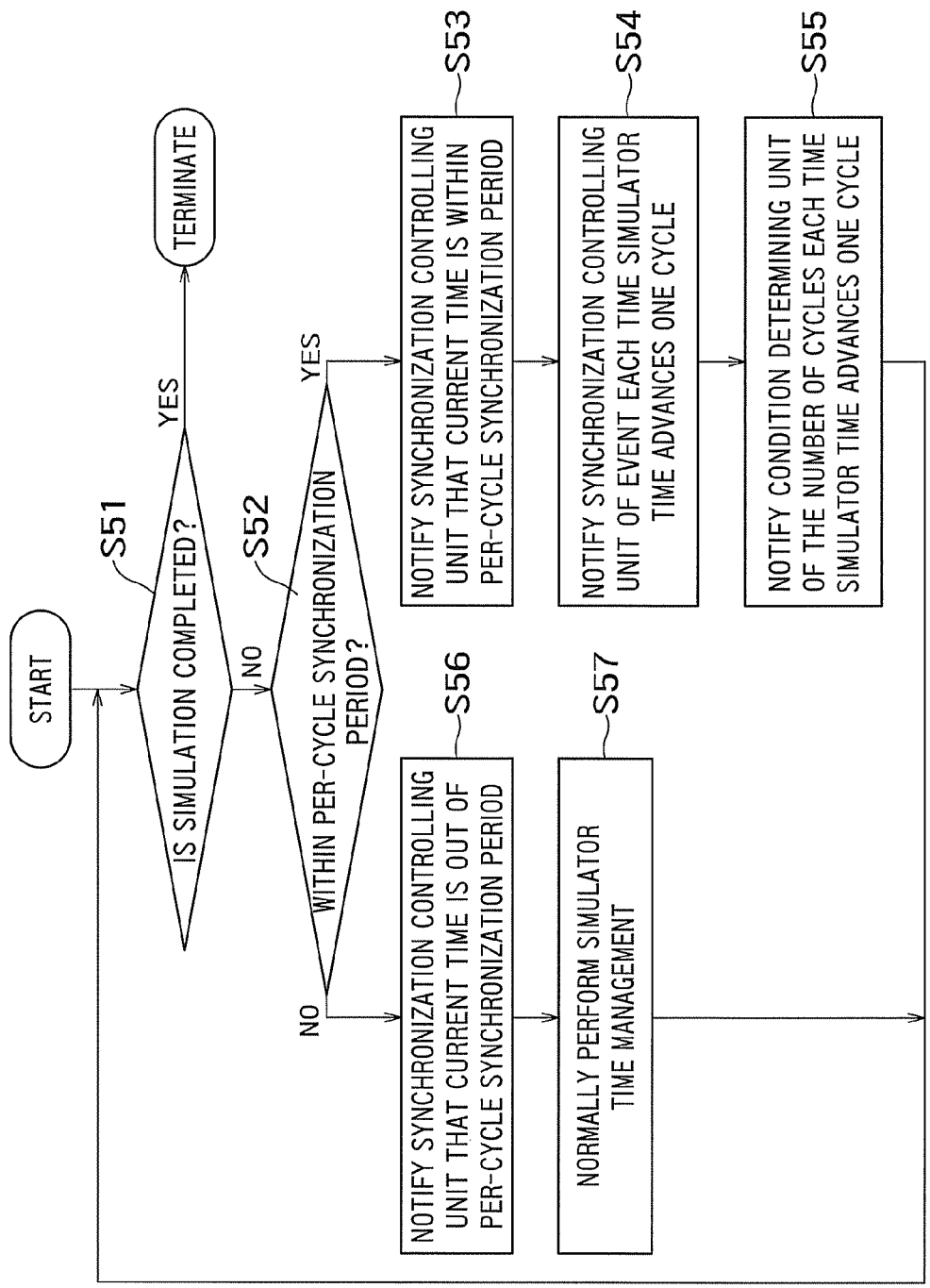
FIG. 8 is a flowchart explaining a process flow of a simulation controlling unit.

FIG. 8 is a flowchart explaining a process flow of the simulation controlling unit 26.

In the process flow, a process of determining whether a current time is within or out of the per-cycle synchronization period, and a process performed within the per-cycle synchronization period are described. Since well known techniques are used to control the entire SW simulator and manage an internal time (manage the number of cycles), a description thereof is omitted. As to the time management, time count (count of the number of cycles) may be performed, for example, by using a clock generated by executing a command in which clock generation is described, or by using a clock generated from a clock generating mechanism mounted inside a computer.

As shown in FIG. 8, the simulation controlling unit 26 checks whether the simulation has been completed (S51). When the simulation has been completed (S51, YES), the process is terminated. When the simulation has not been completed (S51, NO), the simulation controlling unit 26 checks whether the current time is during per-cycle synchronization (within the per-cycle synchronization period) based on whether the instruction to start the per-cycle synchronization has been given from the condition determining unit 39 (S52). When the result is YES, the simulation controlling unit 26 notifies the synchronization controlling unit 23 that the current time is within the per-cycle synchronization period (S53). Then, the simulation controlling unit 26 notifies the synchronization controlling unit 23 of an event which indicates that a simulator time managed by the simulator time managing unit 40 advances one cycle each time the simulator time advances one cycle (S54). The simulation controlling unit 26 also notifies the condition determining unit 39 of the current number of cycles each time the simulator time advances one cycle (S55). After that, the process returns to S51.

On the other hand, when it is determined in S52 that the current time is not during per-cycle synchronization (out of the per-cycle synchronization period) (S52, NO), the simulation controlling unit 26 notifies the synchronization controlling unit 23 that the current time is out of the per-cycle synchronization period (S56), and the time in the simulator time managing unit 40 advances normally. Then, the process returns to S51.

Figure 9:
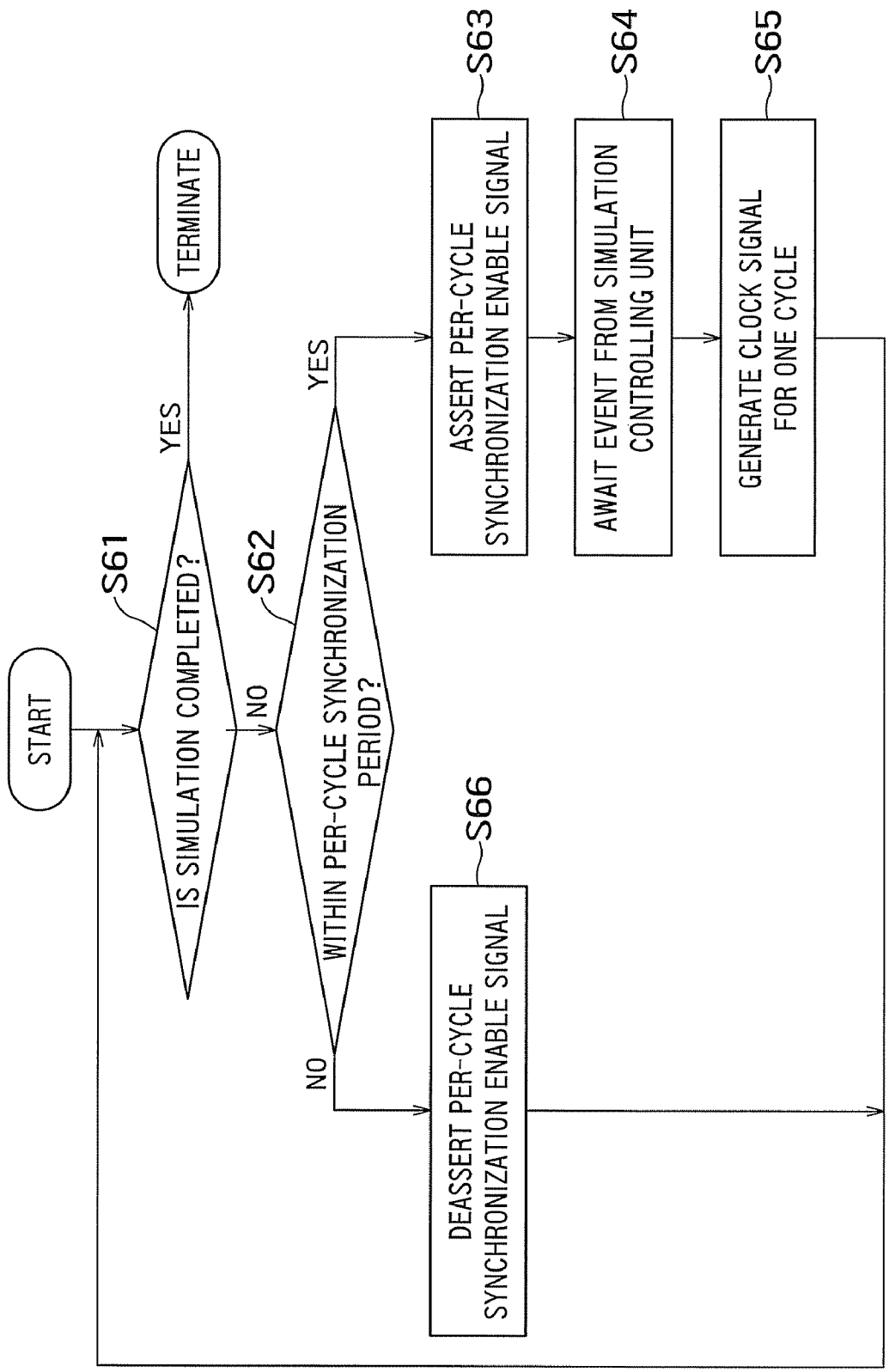
FIG. 9 is a flowchart explaining a process flow of a synchronization controlling unit.

FIG. 9 is a flowchart illustrating a process flow of the synchronization controlling unit 23.

The synchronization controlling unit 23 checks whether the simulation has been completed (S61). When the simulation has been completed (S61, YES), the process is terminated. When the simulation has not been completed yet (S61, NO), the synchronization controlling unit 23 checks whether the current time is during per-cycle synchronization (within the per-cycle synchronization period) based on the notification from the simulation controlling unit 26 (S62). When the result is YES, the synchronization controlling unit 23 asserts a per-cycle synchronization enable signal on a clock generating unit 27 on the FPGA board 12 (S63). The synchronization controlling unit 23 awaits the event which indicates that the simulator time advances one cycle from the simulation controlling unit 26 (S64). When receiving the event, the synchronization controlling unit 23 generates a clock signal for one cycle (S65). After that, the process returns to S61.

On the other hand, when it is determined in S62 that the current time is not during per-cycle synchronization (out of the per-cycle synchronization period) (S62, NO), the synchronization controlling unit 23 deasserts a per-cycle synchronization enable signal on the clock generating unit 27 on the FPGA board 12 (S66). Then, the process returns to S61.

Figure 10:
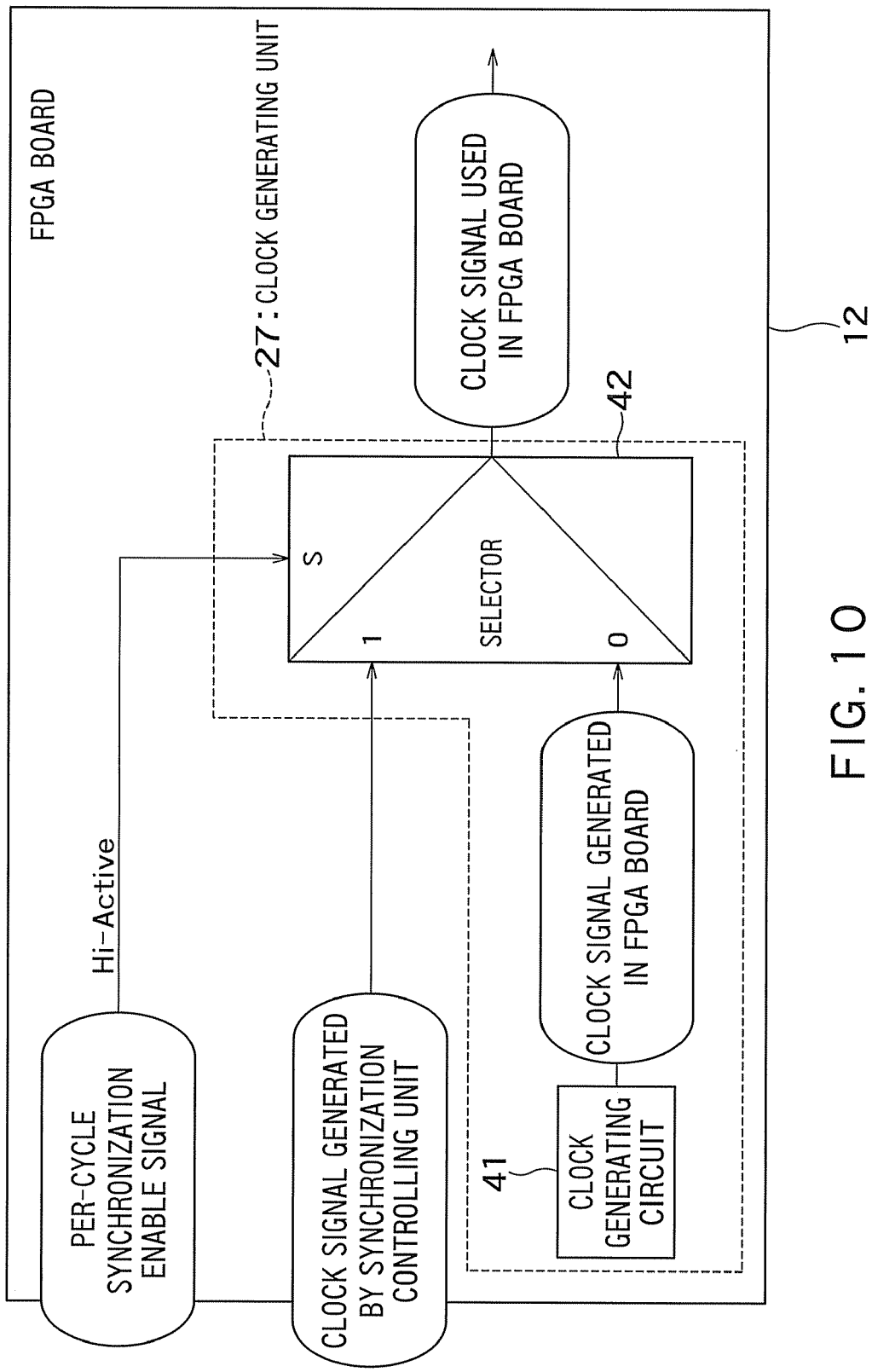
FIG. 10 illustrates a configuration of a clock generating unit on an FPGA board.

FIG. 10 illustrates a configuration example of the clock generating unit 27 on the FPGA board 12.

The clock generating unit 27 includes a clock generating circuit 41 for generating a clock, and a selector 42. A frequency of the clock generated by the clock generating circuit 41 is higher than a frequency of the clock used in the SW simulator 11. When the per-cycle synchronization enable signal input from the synchronization controlling unit 23 is being asserted (high), the selector 42 selects and outputs the clock signal input from the synchronization controlling unit 23. When the per-cycle synchronization enable signal is being deasserted (low), the selector 42 selects and outputs the clock signal generated by the clock generating circuit 41. The clock signal output from the selector 42 is used as an operation clock of an FPGA circuit 28.

Figure 11:
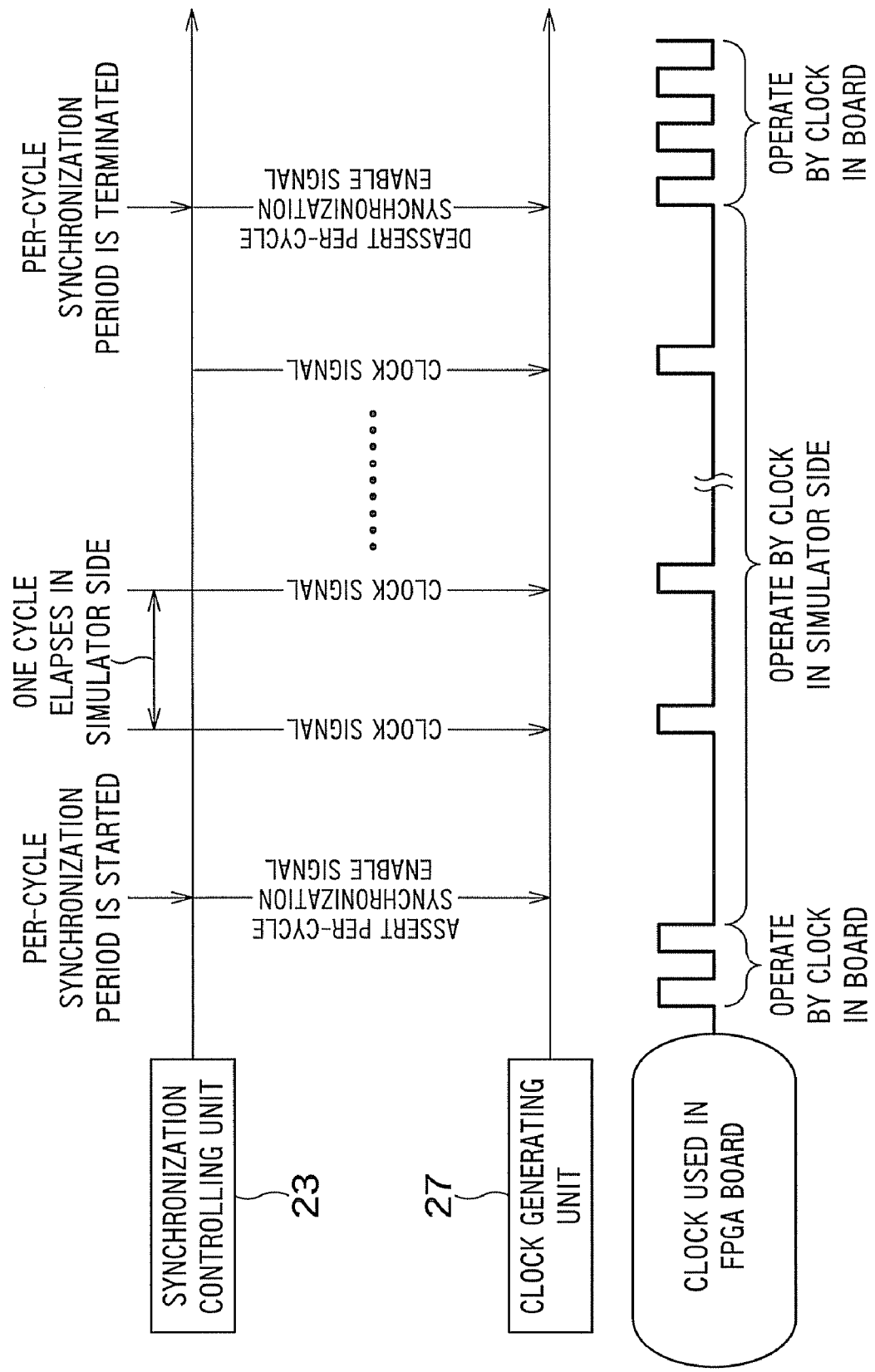
FIG. 11 illustrates an operation image between a synchronization controlling unit and a clock generating unit.

FIG. 11 is a timing chart showing an interaction between the synchronization controlling unit 23 in the SW simulator 11 side and the clock generating unit 27 in the FPGA board 12 side. It will be understood that the FPGA board operates based on the clock generated by the clock generating unit 27 out of the per-cycle synchronization period, and the FPGA board operates at the same clock frequency as that of the SW simulator 11 within the per-cycle synchronization period.

Here, the present embodiment may be also combined with a technique for accelerating the bus access by using the bus transactor as an operation when a device on the FPGA board is accessed from the SW simulator, as processing in the FPGA board side. In this case, for example, there is performed such processing that, when a bus transaction occurs from the SW simulator side, a circuit on the FPGA board is accessed via the bus transactor (by synchronizing the SW simulator and the FPGA board) and a non-synchronization operation is performed again upon termination of the transaction processing. Although such processing can be combined with the technique disclosed in the present invention without contradiction, a detailed description thereof is omitted since the scheme of using the bus transactor is already well known.

Also, the example in which the hardware side operations are substituted by emulation by the FPGA board is described in the present embodiment. However, if the clock generating unit can be implemented in the hardware side, co-simulation may be also executed by using a board or the like on which real hardware such as ASIC is mounted.

Also, all the PC monitoring unit, the address monitoring unit, and the memory/register value monitoring unit are disposed in the SW monitoring unit 22 in the present embodiment. However, monitoring functions provided to the SW monitoring unit 22 may be partly included in at least one of the CPU simulating unit 21, the peripheral circuit simulating unit 25, and the memory simulating unit 24 such that, for example, a function of monitoring the PC is provided inside the CPU simulating unit 21, a function of monitoring the access to the address assigned to the register of peripheral circuits is provided inside the peripheral circuit simulating unit 25, or a function of monitoring the access to the address assigned to the memory is provided inside the memory simulating unit 24.

As described above, the SW simulator and the FPGA board are synchronized only in the synchronization period from when the execution state of the software satisfies the synchronization start condition until when the execution state of the software satisfies the synchronization termination condition according to the present embodiment. Therefore, highly-accurate and high-speed simulation can be achieved without deteriorating the high speed property of the FPGA board and while suppressing the overhead of the synchronization between the SW simulator and the FPGA board. For example, verification of whether an interrupt from the FPGA board occurs "in time", or "not in time" with respect to time constraints of software from when the software activates a certain hardware operation can be achieved in a high-speed and easy-to-use environment.

Second Embodiment

Although the example in which the co-simulation of the SW simulator and the FPGA board is performed is described in the first embodiment, the technique which is fundamental to the present invention is not limited to such combinations described in the first embodiment. A second embodiment shows an example of co-simulation by combining the SW simulator and an HW simulator.

Figure 12:
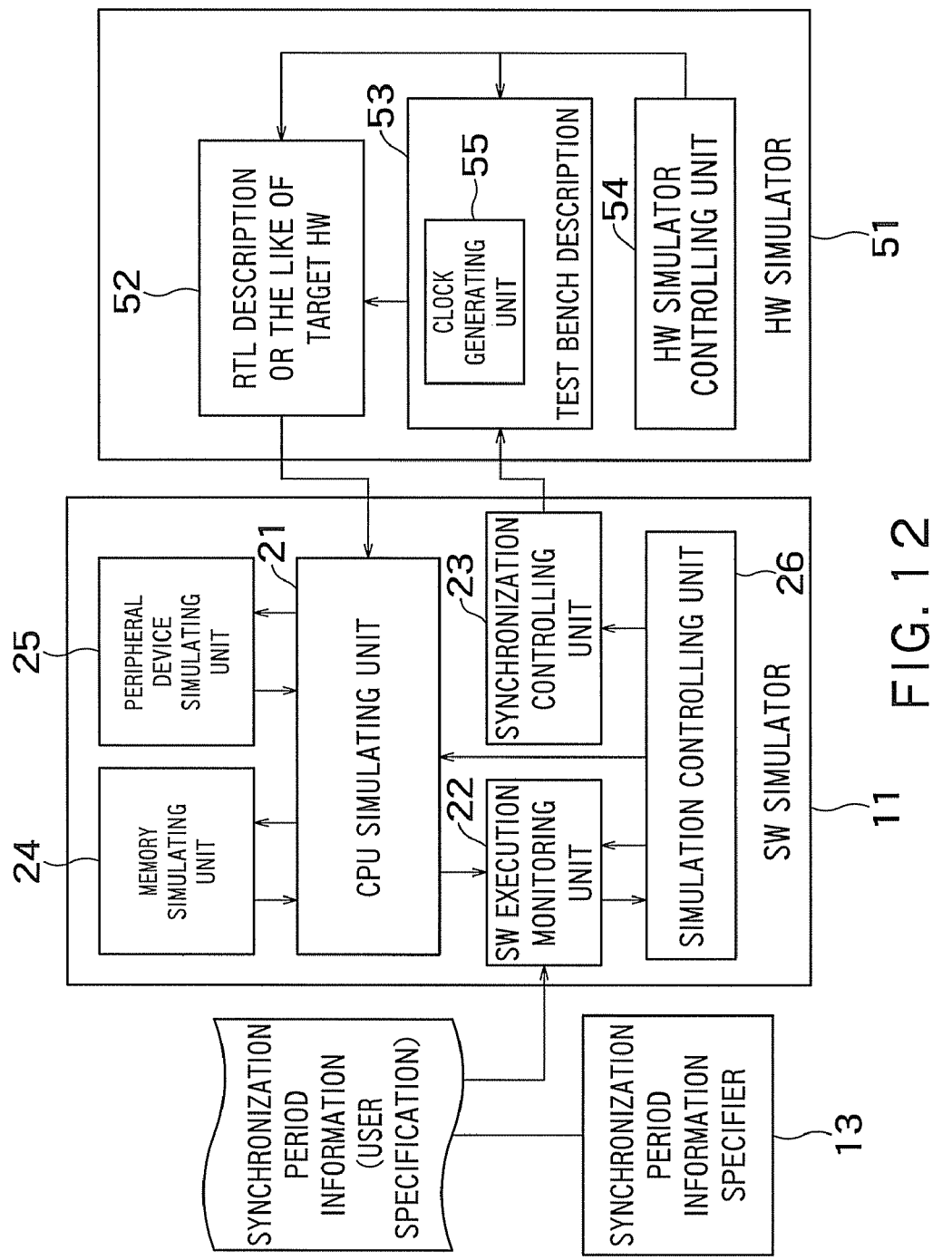
FIG. 12 is an entire configuration diagram of a hardware/software co-simulator according to a second embodiment of the present invention.

FIG. 12 is a block diagram illustrating an entire configuration of an HW/SW co-simulator according to the second embodiment of the present invention. The elements having the same names as those in FIG. 1 are assigned the same reference numerals, and descriptions thereof are omitted since operations thereof are the same as those of the corresponding elements in FIG. 1. In specific, the operations in the SW simulator 11 side are equal to those in the first embodiment.

An HW simulator 51 performs simulation of hardware by using a hardware description (an RTL description or the like of target hardware) 52 and a test bench description 53 for simulation. An HW simulator controlling unit 54 controls entire simulation. A description 55 for generating a clock is included in the test bench description 53. That is, a clock generating unit 55 is provided to the test bench description 53. The hardware description operating on the HW simulator is normally simulated in combination with the test bench for simulation, and in the present embodiment, the description for generating a clock is included in the test bench. Therefore, an existing HW simulator body can be directly used.

Figure 13:
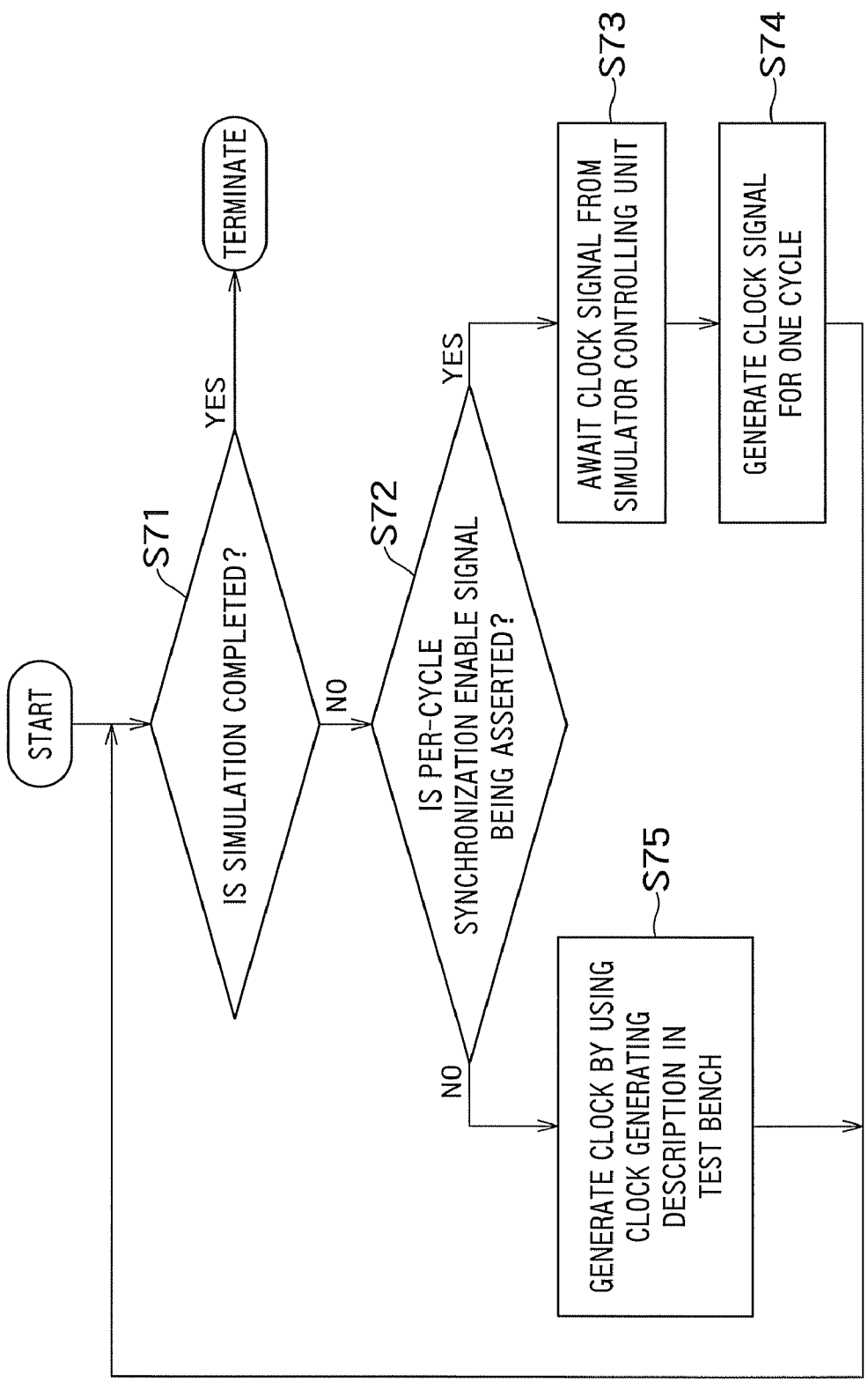
FIG. 13 is a flowchart explaining operations of a clock generating unit in an HW simulator side in FIG. 12.

FIG. 13 is a flowchart illustrating a process flow of the clock generating unit 55 in the HW simulator 51 side.

The clock generating unit 55 checks whether the simulation has been completed (S71). When the simulation has been completed (S71, YES), the process is terminated. When the simulation has not been completed (S71, NO), the clock generating unit 55 checks whether the per-cycle synchronization enable signal from the synchronization controlling unit 23 in the SW simulator 11 is being asserted (S72). When the signal is being asserted (S72, YES), the clock generating unit 55 awaits the clock signal from the synchronization controlling unit 23 (S73). When receiving the clock signal, the clock generating unit 55 generates a clock signal for one cycle (S74), and the process returns to S71. On the other hand, when the per-cycle synchronization enable signal is not being asserted (S72, NO), a clock is generated using the clock generating description in the test bench description 53 (S75). After that, the process returns to S71.

In the description of the process flow of FIG. 13, the clock signal is generated by the clock generating unit 55 described in the test bench description out of the synchronization period. However, the clock generation may be completely stopped except during the bus access in the SW simulator 11 side. The simulation speed can be improved by stopping the HW simulation operation and thereby reducing an entire simulation load.

Third Embodiment

Figure 14:
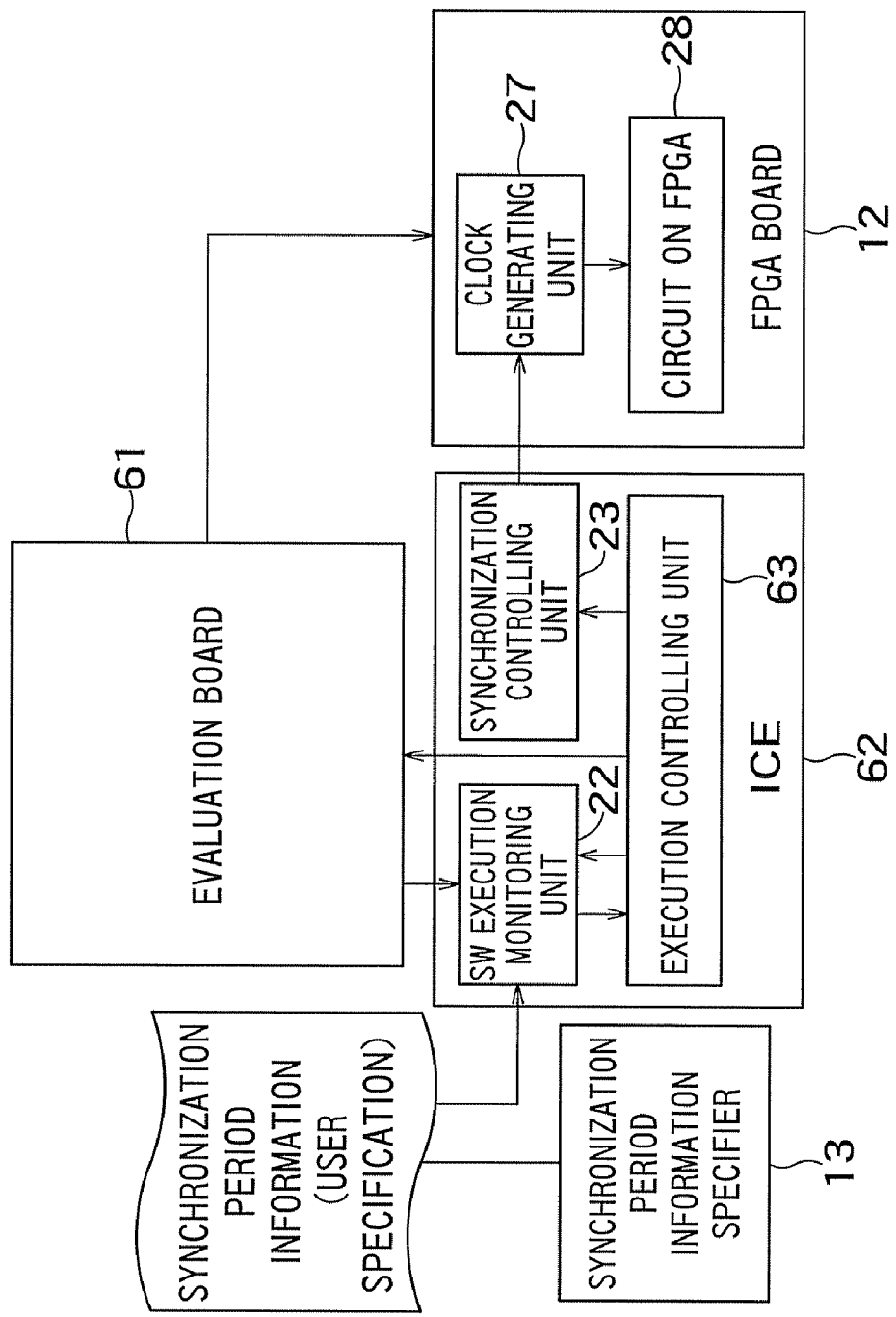
FIG. 14 is an entire configuration diagram of a hardware/software co-simulator according to a third embodiment of the present invention.

FIG. 14 illustrates an example in which an evaluation board 61 on which a real CPU is mounted and an in circuit emulator (ICE) 62 are used for the operations in the software side according to a third embodiment of the present invention. Combination of the evaluation board and the ICE 62 corresponds to the software executing device. The elements having the same names as those in FIG. 1 are assigned the same reference numerals to omit redundant descriptions. An execution controlling unit 63 in the ICE 62 has functions equal to those of the simulation controlling unit 26 in FIG. 1. By using the ICE or the like, information of an operation state (a program counter value, an address of bus access, a memory/register value) of software operating on the real CPU can be referenced. Here, the information of the operation state of the software can be obtained by the PC monitoring unit, the address monitoring unit, and the memory/register value monitoring unit included in the SW execution monitoring unit 22 mounted on the ICE 62. Co-simulation equal to that in the first embodiment can be thereby achieved.

In the case of the configuration in FIG. 14, there may be a case in which a system of the evaluation board plus the ICE operates at a higher speed than the FPGA board. In such a case, an operation frequency of the entire system of the evaluation board plus the ICE can be controlled to be reduced to an operation frequency of the FPGA board. Although an execution speed of the software is reduced, there still remains an advantage that a verified item of whether a certain time condition is satisfied can be correctly evaluated since the number of execution steps of the software and a throughput of the hardware side in the period specified for the per-cycle synchronization can be equalized with real-time operations (operations when implemented on one LSI).

What is claimed is:

1. A software executing device co-operating with a hardware circuit or a hardware simulator, comprising:
 a software executing unit configured to execute a software;
 an execution monitoring unit configured to monitor execution of the software by the software executing unit to sequentially obtain an execution state of the software;
 a determining unit configured to determine whether the software executing unit and the hardware circuit or the hardware simulator are to be synchronized based on an obtained execution state of the software; and
 a synchronization controlling unit configured to synchronize one cycle of internal time in the software executing unit with generation of clocks in the hardware circuit or the hardware simulator when the determining unit has determined to synchronize the software executing unit with the hardware circuit or the hardware simulator.

2. The device according to claim 1, wherein
 the determining unit determines start and termination of the synchronization based on synchronization period information in which a start condition and a termination condition of the synchronization are described using the execution state of the software, and
 the synchronization controlling unit synchronizes the software executing unit and the hardware circuit or the hardware simulator from when the start of the synchronization is determined until when the termination of the synchronization is determined.

3. The device according to claim 2, further comprising:
 a time counter configured to count a time, wherein
 the synchronization period information describes the start condition or the termination condition using the time, and
 the determining unit determines start or termination of the synchronization by further using the time counter.

4. The device according to claim 1, wherein
 the monitoring unit obtains a value of a program counter, an address to be accessed by the software executing unit, and data read out or written for the address to be accessed, as the execution state of the software and
 the determining unit performs determination by using an obtained value, an obtained address, obtained data or combinations of these.

5. The device according to claim 1, wherein
 the synchronization controlling unit generates a clock to be used at the hardware circuit or the hardware simulator and provides a change instruction of a clock and a generated clock to the hardware circuit or the hardware simulator so that the synchronization is effected.

6. The software executing device according to claim 1, wherein the software executing unit is a CPU.

7. A co-operation system including a hardware circuit or a hardware simulator, and a software executing device co-operating with the hardware circuit or the hardware simulator, wherein
 the software executing device comprising:
 a software executing unit configured to execute a software;
 an execution monitoring unit configured to monitor execution of the software by the software executing unit to sequentially obtain an execution state of the software;
 a determining unit configured to determine whether the software executing unit and the hardware circuit or the hardware simulator are to be synchronized based on an obtained execution state of the software; and a synchronization controlling unit configured to synchronize one cycle of internal time in the software executing unit with generation of clocks in the hardware circuit or the hardware simulator when the determining unit has determined to synchronize the software executing unit with the hardware circuit or the hardware simulator.

8. The system according to claim 7, wherein,
the hardware circuit is an FPGA board which includes a clock generating circuit generating a clock and an FPGA circuit operating with the clock generated by the clock generating circuit.

9. The system according to claim 8, wherein,
the synchronization controlling unit in the software executing device generates a clock to be used at the FPGA board and provides a change instruction of a clock and a generated clock to the FPGA board,
the FPGA board receives the change instruction and the generated clock and controls so that the generated clock is used at the FPGA circuit instead of the clock generated by the clock generating circuit.

10. The system according to claim 7, wherein,
the hardware simulator performs a hardware simulation using a test bench description which includes a hardware description and a clock generating description.

11. The system according to claim 10, wherein,
the synchronization controlling unit in the software executing device generates a clock to be used at the hardware simulator and provides a change instruction of a clock and a generated clock to the hardware simulator,
the hardware simulator perform a simulation by using the generated clock in a case of receiving the change instruction and the generated clock and generates the clock according to the clock generating description to perform the simulation in a case of not receiving the change instruction and the generated clock.

12. The system according to claim 7, wherein,
the software executing unit in the software executing device is a board having a CPU which executes the software,
a set of the execution monitoring unit, the determining unit and the synchronization controlling unit forms an ICE (In Circuit Emulator) communicating with the board.

13. The system according to claim 7, wherein
the determining unit in the software executing device determines start and termination of the synchronization based on synchronization period information in which a start condition and a termination condition of the synchronization are described using the execution state of the software, and
the synchronization controlling unit in the software executing device synchronizes the software executing unit and the hardware circuit or the hardware simulator from when the start of the synchronization is determined until when the termination of the synchronization is determined.

14. The system according to claim 7, further comprising:
the software executing device includes a time counter configured to count a time, wherein
the synchronization period information describes the start condition or the termination condition using the time, and
the determining unit in the software executing device determines start or termination of the synchronization by further using the time counter.

15. The system according to claim 7, wherein
the monitoring unit in the software executing device obtains a value of a program counter, an address to be accessed by the software executing unit, and data read out or written for the address to be accessed, as the execution state of the software and
the determining unit performs determination by using an obtained value, an obtained address, obtained data or combinations of these.

16. A co-operation method of bringing a software executing device into co-operation with a hardware circuit or a hardware simulator, comprising:
executing the software at the software executing device;
monitoring an execution of the software to sequentially obtain an execution state of the software;
determining whether the software executing device and the hardware circuit or the hardware simulator are to be synchronized based on an obtained execution state of the software; and
synchronizing the software executing device and the hardware circuit or the hardware simulator when the software executing device and the hardware circuit or the hardware simulator are determined to be synchronized
wherein one cycle of internal time in the software executing device is synchronized with generation of clocks in the hardware circuit or the hardware simulator.

17. The method according to claim 16, wherein
the determining includes determining start and termination of the synchronization based on synchronization period information in which a start condition and a termination condition of the synchronization are described using the execution state of the software, and
the synchronizing includes synchronizing the software executing device and the hardware circuit or the hardware simulator from when the start of the synchronization is determined until when the termination of the synchronization is determined.

18. The method according to claim 17, further comprising:
counting a time, wherein
the synchronization period information describes the start condition or the termination condition using the time, and
the determining includes determining start or termination of the synchronization by further using the time counter.

19. The method according to claim 16, wherein
the monitoring includes obtaining a value of a program counter, an address to be accessed by the software executing unit, and data read out or written for the address to be accessed, as the execution state of the software and
the determining includes performing determination by using an obtained value, an obtained address, obtained data or combinations of these.

20. The method according to claim 16, wherein
the synchronizing includes a generating clock to be used at the hardware circuit or the hardware simulator and providing a change instruction of a clock and a generated clock to the hardware circuit or the hardware simulator so that the synchronization is effected.

* * * * *